United States Patent [19]

Bazes

[11] Patent Number: 4,975,702
[45] Date of Patent: Dec. 4, 1990

[54] CMOS WAVEFORM DIGITIZER
[75] Inventor: Mel Bazes, Haifa, Israel
[73] Assignee: Intel Corporation, Santa Clara, Calif.
[21] Appl. No.: 494,130
[22] Filed: Mar. 15, 1990
[51] Int. Cl.$^5$ .......................................... H03M 1/12
[52] U.S. Cl. ............................... 341/155; 341/122
[58] Field of Search ............... 341/122, 123, 126, 133, 341/141, 155; 307/354

[56] References Cited

U.S. PATENT DOCUMENTS

| | | | |
|---|---|---|---|
| 4,112,426 | 9/1978 | Höfer et al. | 341/108 |
| 4,272,759 | 6/1981 | Handy | 341/133 |
| 4,633,222 | 12/1986 | Dingwall | 341/122 |
| 4,768,017 | 8/1988 | Gordon | 341/122 |
| 4,833,445 | 5/1989 | Buchele | 341/122 X |

Primary Examiner—William M. Shoop, Jr.
Assistant Examiner—H. L. Williams
Attorney, Agent, or Firm—Blakely, Sokoloff, Taylor & Zafman

[57] ABSTRACT

An integrated circuit for digitizing a dynamic waveform with a resolution that is much higher than that which is achievable under prior art methods is disclosed. A reference clock signal $T_r$ is provided as input to at least two L-type registers over a synchronous delay line (SDL). The reference clock signal is also coupled to the L ports of the L-type registers over a sample enable circuit. The incoming waveform is input in parallel to both L-type registers. The SDL generates timing pulses at intervals that are separated by $T_r/N$, where N is the number of taps in the SDL. N corresponds to the equally spaced intervals at which the incoming waveform is sampled. The L-type register samples the incoming waveform according to control signals provided by the sample enable circuit. The control signals are required to guarantee the set-up and hold times for the flip-flops in the L-type register. Thus, the resolution of the digitized waveform is $T_r/N$. This resolution is N times better than that achievable with the prior art method. The dual arrangement of the L-type register also forecloses the occurrence of any metastable states in the flip-flops of the L-type register, thus guaranteeing a continuous sampling of the incoming waveform. The outputs from the dual L-type registers are input to a muliplexer and further to a D-type register before it is outputted as a digitized waveform. The muliplexer selects the appropriate stream of sampled waveform alternatively from one of the L-type registers. Therefore, the present inventions also provide precise information about the transitions of the dynamic waveform by digitizing of the incoming waveform continuously.

6 Claims, 9 Drawing Sheets

CMOS WAVEFORM DIGITIZER

BACKGROUND OF THE INVENTION

1. Field of the Invention:

The invention relates to the field of digitizing waveforms for subsequent digital processing and, in particular, for metal oxide semiconductor (MOS) circuits.

2. Art Background:

It is quite common for integrated circuits to convert a dynamic waveform into digital form for subsequent digital processing. The dynamic waveform is translated into strings of ones and zeros according to the shape of the waveform. The most common method for digitizing a dynamic waveform is to sample the waveform using a reference clock whose period is $T_r$ which is much shorter than the period of the waveform, $T_w$.

The resolution achievable with the prior art method of digitizing waveforms is equal to the reference clock period $T_r$. In complementary metal oxide semiconductor (CMOS) technology, as in any other semiconductor technology, a certain limit on the highest practical clock frequency exists in any generation of the technology. Thus, the clock frequency cannot be increased without limit in order to improve the resolution of the digitized waveform. Therefore, the resolution achievable with the prior art method is limited to the shortest practical reference clock period $T_r$ in that generation of CMOS technology. In practice, the prior art methods of digitizing a waveform is only practical for a waveform which has very infrequent transitions—transitions that are separated by intervals that are many times greater than $T_r$. As such, the prior art method of digitizing a waveform is not workable for a waveform whose transitions are separated by intervals approaching the reference clock period $T_r$. For dynamic waveforms whose transitions are separated by periods less than the reference clock period $T_r$, the prior art method is non-functional.

It is an object of the present invention to capture a waveform in digitized form for subsequent digital processing with a resolution that is not achievable with prior art method of digitizing waveforms.

It is another object of the present invention to digitize a dynamic waveform with a resolution $T_w$ approaching $T_r$.

It is yet another object of the present invention to digitize a dynamic waveform by providing sufficient time for sampling while achieving continuous digitizing of the waveform.

SUMMARY OF THE INVENTION

An integrated circuit for digitizing a dynamic waveform with a resolution that is much higher than that which is achievable under prior art methods is disclosed. A reference clock signal $T_r$ is provided as input to at least two L-type registers over a synchronous delay line (SDL). The reference clock signal is also coupled to the L ports of the L-type registers over a sample enable circuit. The incoming waveform is input in parallel to both L-type registers. The SDL generates timing pulses at intervals that are separated by $T_r$ divided by N where N is the number of taps in the SDL. N corresponds to the equally spaced intervals at which the incoming waveform is sampled. The L-type register samples the incoming waveform according to control signals provided by the sample enable circuit. The control signals are required to guarantee the set-up and hold times for the flip-flops in the L-type register. Thus, the resolution of the digitized waveform is $T_r$ divided by N. This resolution is N times better than that which is achievable with the prior art method. The dual arrangement of the L-type register also forecloses the occurrence of any metastable states in the flip-flops of the L-type register, thus guaranteeing a continuous sampling of the incoming waveform. The outputs from the dual L-type registers input to a multiplexer and further to a D-type register before it is outputted as a digitized waveform. The multiplexer selects the appropriate stream of sampled waveform alternatively between one of the L-type registers. The output of the D-type register is the digitized waveform delayed by one clock cycle. Therefore, the present inventions also provide precise information about the transitions of the dynamic waveform as the continuous digitizing of the incoming waveform is achieved by foreclosing the possibility of any of the L-type registers going into a metastable state.

DETAILED DESCRIPTION OF THE INVENTION

An integrated circuit is disclosed for digitizing a waveform for subsequent digital processing in an integrated circuit. In the following description, numerous specific details are set forth, such as specific circuits, in order to provide a thorough understanding of the present invention. It will be obvious, however, to one skilled in the art that the present invention may be practiced without these specific details. In other instances, well known circuits are not described in detail in order not to unnecessarily obscure the present invention. In the presently preferred embodiment, the invention is realized as part of a metal oxide semiconductor (MOS) integrated circuit. The invention may be fabricated employing any of the many well-known MOS processes for complementary metal oxide semiconductor (CMOS) processes.

Figure 1:
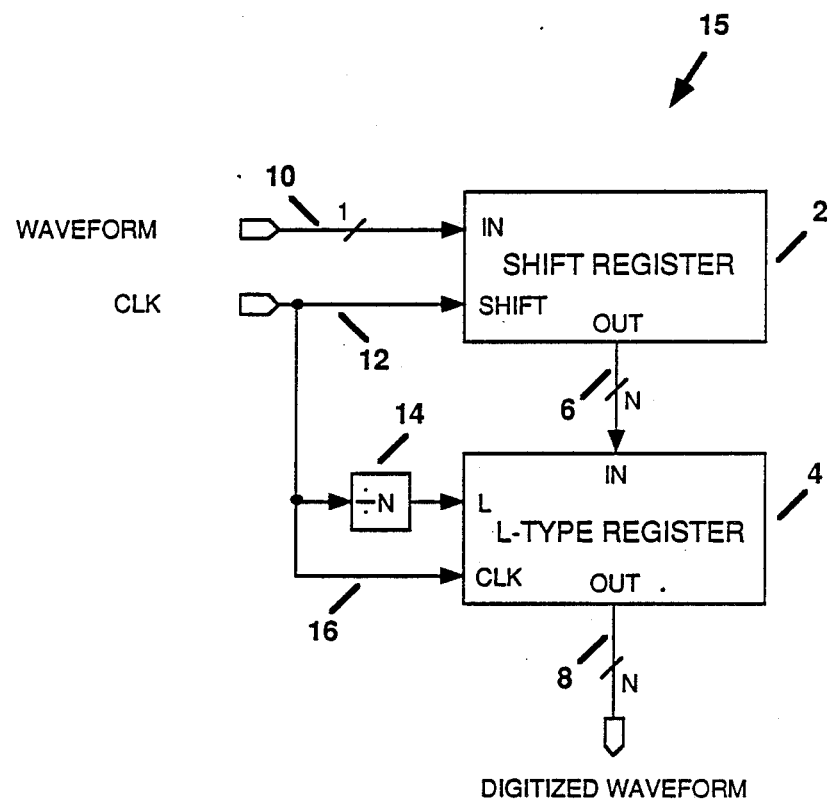
FIG. 1 is prior art circuit for digitizing an incoming dynamic waveform.

The most common method for digitizing a dynamic waveform is to sample the incoming waveform using a reference clock period whose clock period is $T_r$ which is much shorter than the period of the incoming waveform, $T_w$. FIG. 1 is a prior art waveform digitizing circuit. The waveform digitizing circuit 15 comprises a shift register 2 and an L-type register 4. An incoming waveform 10 is coupled to the shift register 2 while an external reference clock 12 is also coupled to the shift register 2. At the same time, the external reference clock 12 is also coupled to the L-type register 4 over the divider circuit 14. The reference clock has a period $T_r$ which is much shorter than the period of the incoming waveform 10, $T_w$. The shift register 2 shifts in the value of the incoming waveform once every clock. The divider circuit 14 keeps track of the number of clocks that has elapsed. After every N clock where N is the width of the digitized waveform, the contents of the shift register 2 are sampled into the L-type register 4 over the line 6. The L-type register samples its input at the start of a clock period only if the L input is high at that time. Thus, samples of the incoming waveforms are taken at interval $T_r$ and appear at the output of the L-type register 4 over an output line 8.

The resolution of digitized waveforms achievable under the prior art method is theoretically equal to the reference clock period $T_r$. In CMOS, as in any other semiconductor technology, a second limit on the highest practical clock frequency exists in any generation of the technology. Thus, the clock frequency cannot be increased without limit in order to improve the resolution. As such, the prior art method is only practical for waveforms which have very infrequent transitions—transitions that are separated by intervals that are many times greater than $T_r$. While the prior art method of digitizing a dynamic waveform is impractical for waveforms whose transitions are separated by intervals approaching $T_r$, the prior art method is useless for waveforms whose transitions are separated by periods less than $T_r$. As will be described below, the resolution achievable with the present invention is significantly better than that of the prior art method.

Figure 2:
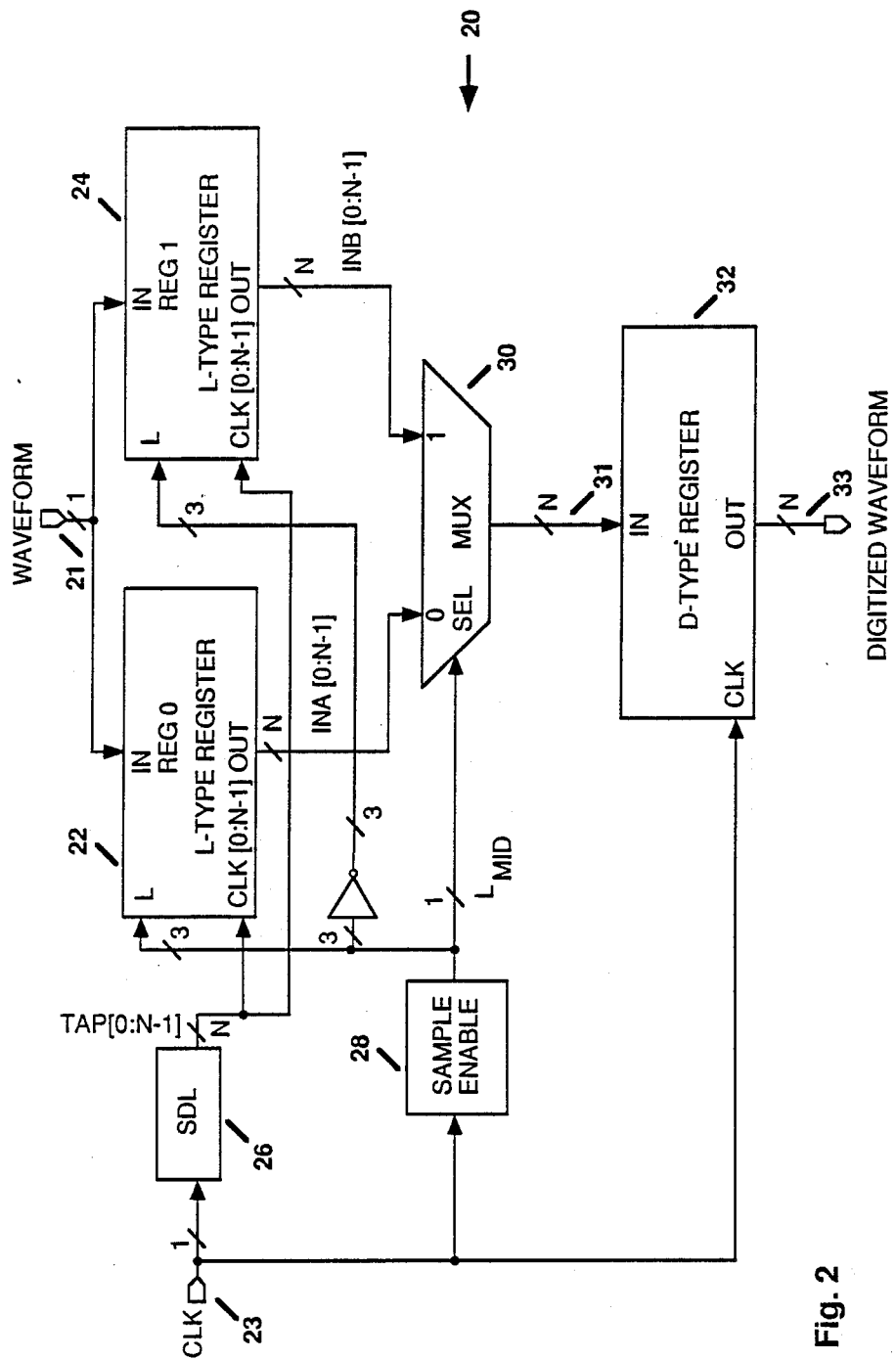
FIG. 2 is a block diagram illustrating the preferred embodiment of the present invention.

FIG. 2 is a block diagram illustrating the waveform digitizing circuit used in the preferred embodiment of the present invention. The waveform digitizing circuit 20 comprises at least two L-type registers 22 and 24, a synchronous delay line (SDL) 26, a sample enable circuit 28, a multiplexer 30, and a D-type register 32. A waveform is provided as input in parallel to the L-type registers 22 and 24 over an input line 21. A reference clock having a period $T_r$ is also provided as input to the L-type register 22 and 24 over the SDL 26 over a line 23. The sample enabling circuit 28 receives the reference control clock having a period of $T_r$ over the line 23 and further providing a plurality of sample control signals as inputs to the L-type register 22 and 24, respectively. The outputs from the L-type register 22 and 24 are provided as inputs to the multiplexer 30. The multiplexer 30 further receives a sample control signal from the sample enable circuit 28. Upon receiving the sample control signal from the sample enable circuit 28, the multiplexer 30 outputs the digitized waveform to the D-type register 32 over a line 31. The D-type register 32 is also coupled to the reference clock for delaying the digitized waveform for one clock period before outputting the same over an output line 33.

The preferred embodiment of the SDL 26 for use with the present invention is described fully in the pending patent application Ser. No. 07/434,408, filed on Nov. 13, 1989 and entitled "SYNCHRONOUS DELAY LINE WITH QUADRATURE CLOCK PHASES." Although the SDL in 07/434,408 shows eight taps, TAP0:7, it should be understood by one skilled in the art that producing N taps, TAP0:N−1, for the presently preferred embodiment, merely requires adding extra voltage controlled delay (VCD's) stages.

Figure 3:
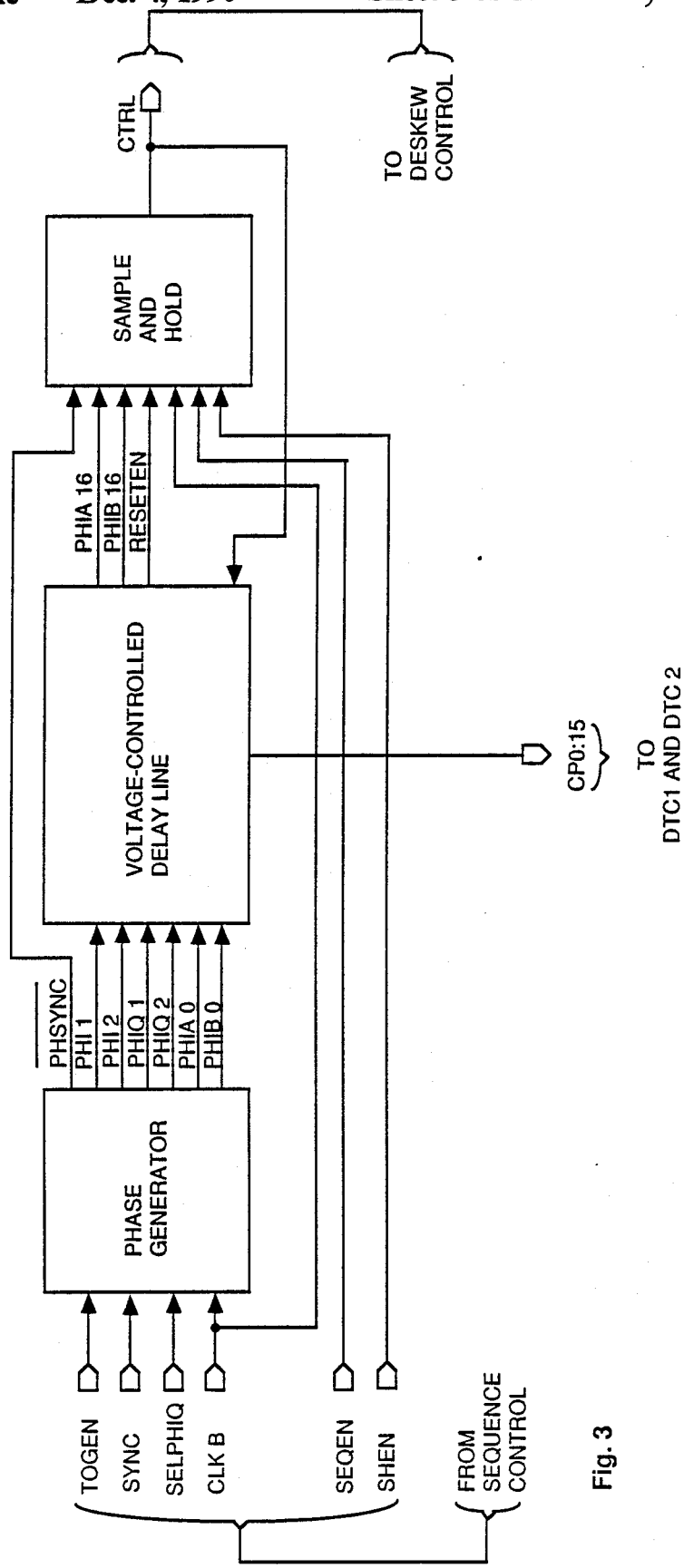
FIG. 3A is an electric schematic of a synchronous delay line (SDL) used in the preferred embodiment of the present invention.
FIG. 3B is a timing diagram of the input into and output from the SDL used in the preferred embodiment of the present invention.
Figure 3A:
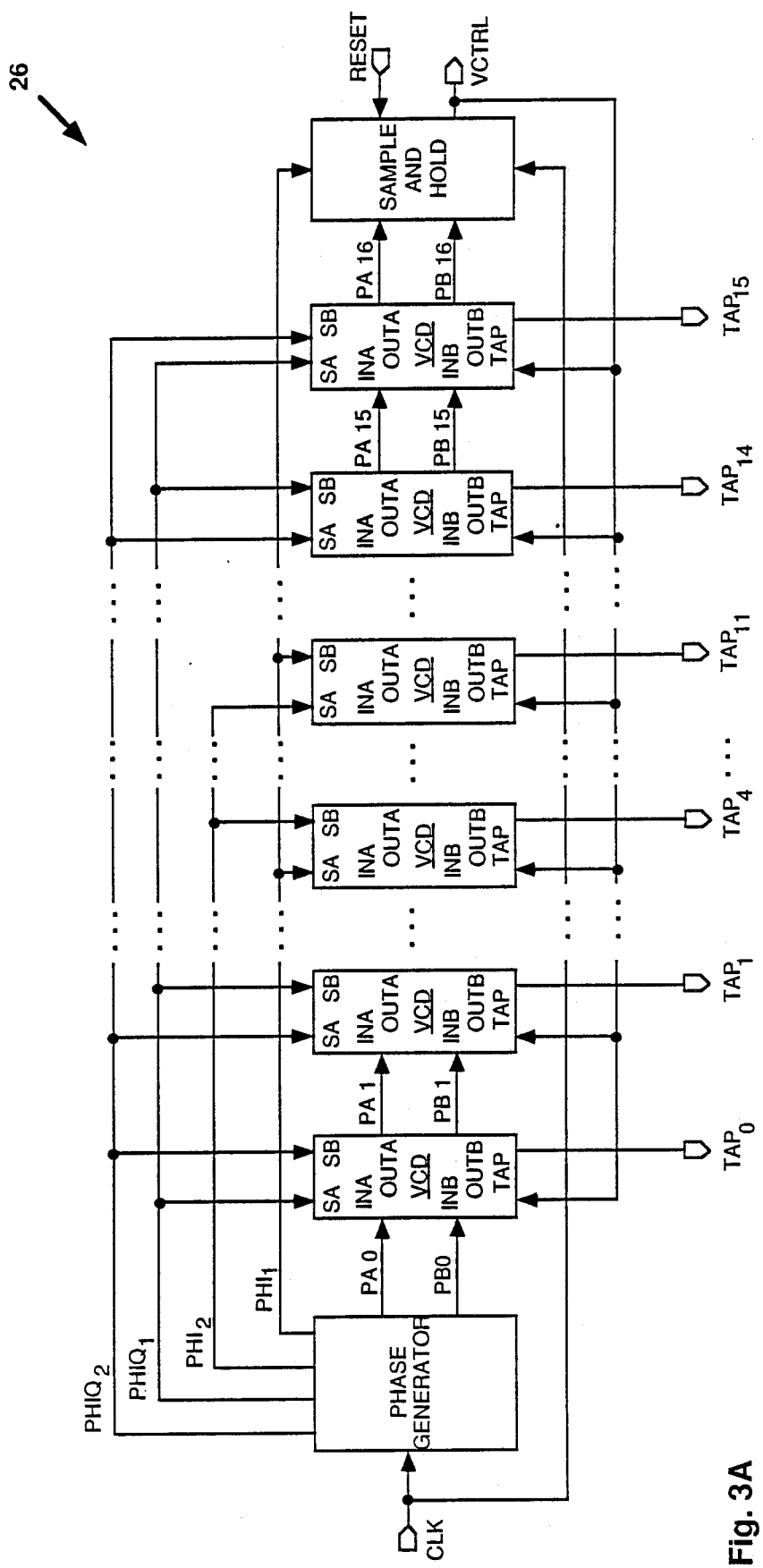

FIG. 3A is an electric schematic of a synchronous delay line (SDL) used in the preferred embodiment of the present invention. FIG. 3A is a modification of FIG. 3 in the patent application Ser. No. 07/434,408. Prior art techniques of utilizing a SDL are also described in U.S. Pat. No. 4,496,861 entitled "INTEGRATED CIRCUIT SYNCHRONOUS DELAY LINE," and in an article entitled "A Novel Precision MOS Synchronous Delay Line", IEEE Journal of Solid State Circuits, Vol. SC-20, pp. 1265-1271, December, 1985.

Figure 3B:
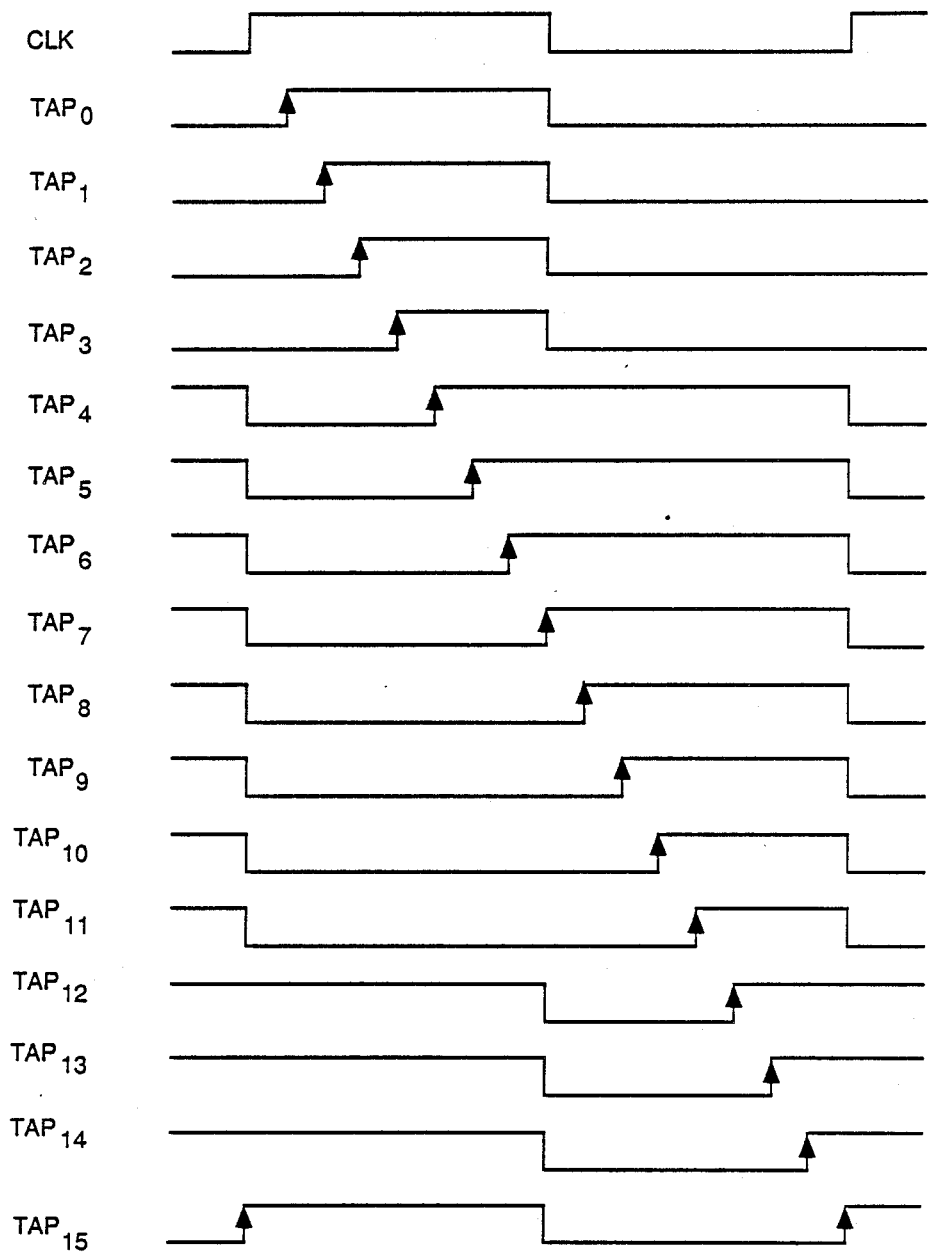

FIG. 3B is a timing diagram of the input signal into and the output signal from a 16-tap SDL. The SDL 26 provides timing pulses at intervals that are separated by $T_r/N$, where N is the number of taps in the SDL. In the preferred embodiment of the present invention, the SDL 26 utilizes quadrature clock phases in order to provide solid low and high times for the taps nearest the ends of the SDL. When a tap goes high, it causes the L-type flip-flop connected to the SDL 26 to sample the value of the waveform at that point in time, provided that the L input of the flip-flop is high when the clock input goes high. The leading edge of a tap going high is illustrated with solid arrows in FIG. 3B. With the SDL 26 the waveform digitizing circuit 20 of the present invention is able to sample the waveform at equally-spaced intervals, N. In the preferred embodiment of the present invention, N is equal to 16. It should be understood by one skilled in the art that N is a design choice and should not serve as a limitation upon the present invention.

Figure 4A:
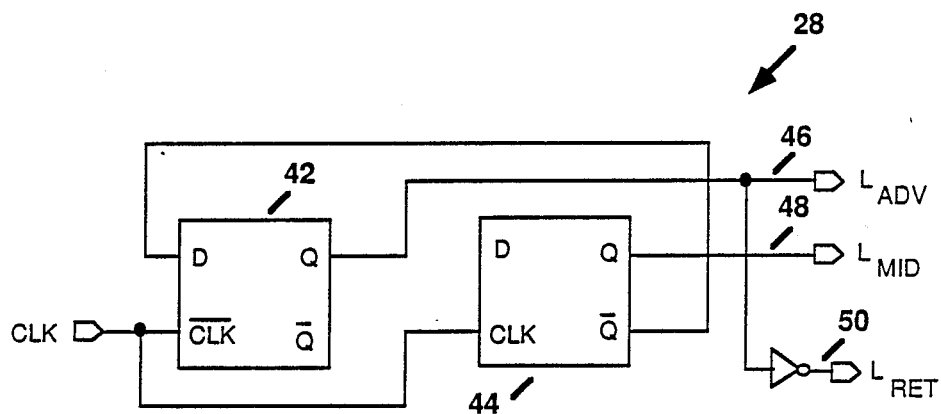
FIG. 4A is an electric schematic of a sample enable circuit used in the preferred embodiment of the present invention.

FIG. 4A is an electric schematic of the sample enable circuit used in the preferred embodiment of the present invention. The sample enable circuit 28 comprises at least two D-type latches 42 and 44. The latch 42 is a low-level triggered latch while the latch 44 is a high-level-triggered latch. Together, the latches 42 and 44 constitute a master-slave pair, i.e., an edge-triggered flip-flop. The clock inputs of the latches 42 and 44 are coupled to the reference clock 23. The D-input of latch 42 is connected to the $\overline{Q}$ output of latch 44. The Q outputs of latch 42 and 44 provide control sample signal $L_{ADV}$ 46, $L_{MID}$ 48 and $L_{RET}$ 50, respectively. The control enable signals 46, 48, and 50 are coupled to the L-type registers 22 and 24 for triggering the sampling of the incoming waveform.

Figure 4B:
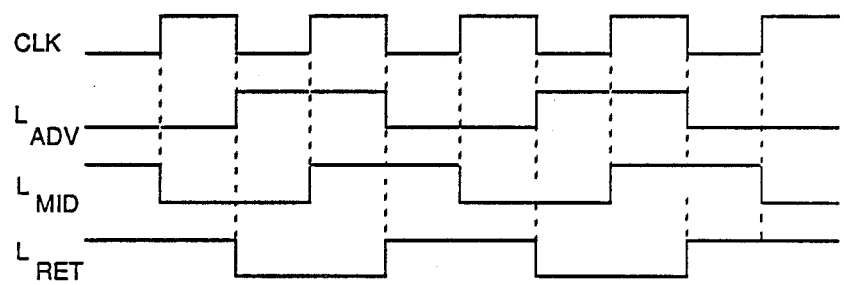
FIG. 4B is the timing diagram of the input into and outputs from the sample enable circuit used in the preferred embodiment of the present invention.

FIG. 4B is a timing diagram of the input into and outputs from the sampling enable circuit 28. The control sample signals 46, 48, and 50 are asserted every other reference clock period. The control sample signals 46, 48, and 50 are coupled to the L-type registers 22 and 24 for initiating the sampling of waveforms once every two reference clocks. The control sample signal 48 is also coupled to the multiplexer 30 for outputting the appropriate streams of digitized waveforms from the L-type registers 22 and 24.

Figure 5A:
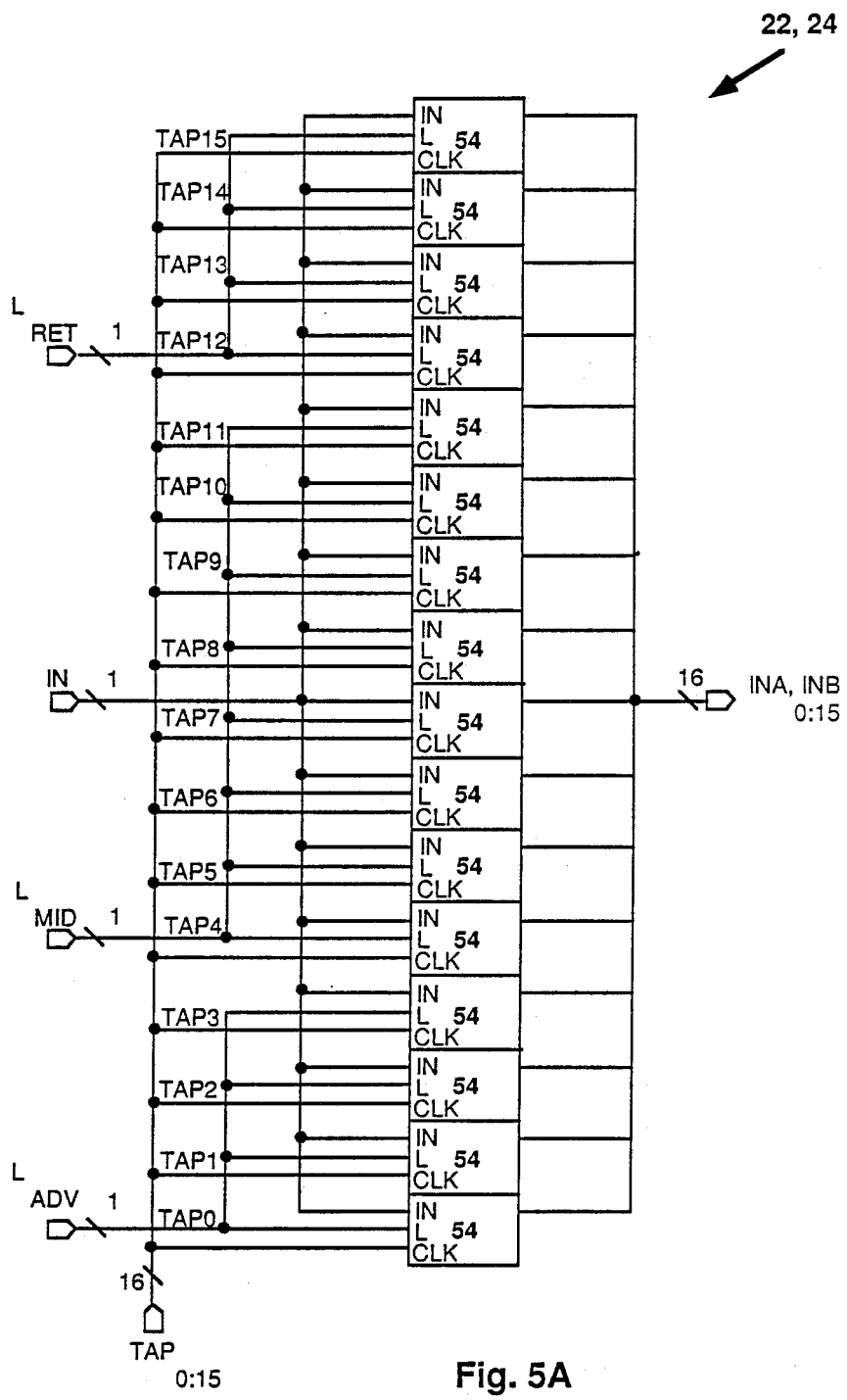
FIG. 5A is an electric schematic of an L-Type register used in the preferred embodiment of the present invention.

FIG. 5A is an electric schematic of the L-type registers used in the preferred embodiment of the present invention. The L-type registers 22 and 24 comprise N individual L-type flip-flops 54, each of whose clock input is driven by one of the N SDL tap outputs. As such, each of the L-type registers is clocked by N clock inputs. In contrast with the prior art, waveform digitizing circuit as illustrated in FIG. 1, only one single clock input 12 is provided to the shift register 2. The waveform is coupled as input to each of the N L-type flip-flops in the L-type registers 22 and 24. Referring again to FIG. 5A, the control sample signals 46, 48, and 50 from the sample enable circuit 28 are coupled to the L-type flip-flops 54 of the L-type registers 22 and 24. The control sample signals 46, 48, and 50 are used to enable each of the L-type registers 22 and 24. The control sample signal 46 enables the first few L-type flip-flops 54 in the L-type register, the control sample signal 48 for the middle L-type flip-flops; and the control sample signal 50 for the last few L-type flip-flops.

The control sample signals 46, 48, and 50 are needed in order to guarantee the set up and hold times of the L-type flip-flops 54. There is a specified setup time, $t_s$, and hold time $t_h$, for any clocked device. Input data must be present and stable from at least $t_s$ before the clock transition and until at least $t_h$ after it, for the proper operation of a clock device such as a flip-flop. See, Horowitz, P., and Hill, W., *The Art of Electronics*, (Cambridge University Press: 1981), Page 346. In the preferred embodiment of the present invention, the setup time requirement of the L-type flip-flop is met if the signal at the L-port of the L-type flip-flop has been stable for at least the setup time before the next transition of the SDL tap. Similarly, the hold time requirement of the L-type flip-flop is met if the signal at the L port of the L-type flip-flop has been stable for at least the hold time after the transition of the SDL tap. As such, the first few taps from the SDL arrive early in the waveform sampling cycle, so the control sample signal 46 is introduced to guarantee a sufficient setup time for the L-type flip-flops to receive them. The earliest of the middle taps from the SDL 26 arrive well after the beginning of the waveform sampling cycle, while the latest among the SDL taps arrive well before the end of the waveform sampling cycle. So a middle period control sample signal 48 is required for the middle taps from the SDL 26. Finally, to account for the last taps arriving late in the sample cycle from the SDL 26, the control signal 50 is provided to guarantee a minimum hold time for the latest taps arriving from the SDL 26. Typically, control sample signal 46 will be connected to the first $\frac{1}{8}$ to $\frac{1}{4}$ of the flip-flops 54 in the L-type register 22 or 24. The control sample signal 48 would be connected to the middle $\frac{1}{2}$ to $\frac{3}{4}$ of the flip-flops 54, while the control sample signal 50 would be connected to the last $\frac{1}{8}$ to $\frac{1}{4}$ of the flip-flops 54. The L-type registers 22 and 24 are enabled on alternate clocks so that only one of the L-type registers samples the input waveform on any one particular reference clock. Since the SDL 26 outputs N equally-spaced precise timing pulses in each clock period $T_r$, the L-type flip-flops 54 in L-type registers 22 and 24 samples the input waveform at the point in time corresponding to the SDL tap-output transition. At the end of the reference clock period $T_r$, N equally-spaced samples of the input waveforms are stored in the L-type register. On the next reference clock, the other L-type register is enabled, and it samples the input waveform at N equally-spaced intervals. Thus, each L-type register 22 and 24 takes a "digital snapshot" of the input waveform that is one clock period wide.

The interval between each SDL output transition is given by $T_r/N$, where $T_r$ is the reference clock period and N is the number of SDL taps. Thus, the resolution of the digitizing operation is $T_r/N$. This digitizing resolution is at least N times better than that achievable with the prior art method where the resolution is equal to $T_r$. The resolution of a waveform digitizing circuit represents the uncertainty in the location of any transition in the digitized waveform. For example, if the reference clock period $T_r$ is 100 nanoseconds and N is 32, then the resolution of the waveform digitizing circuit using the present invention is $100/32 = 3.1$ nanoseconds. In comparison with the prior art waveform digitizing circuit where the resolution is equal to $T_r$, a reference clock having a clock period of (32/100 nanoseconds equals) 320 MHz is required to achieve the equivalent effect. With contemporary MOS technologies, a 320 MHz clocking signal is impractical. Therefore, to digitize a dynamic waveform using N-tap SDL and N L-type flip-flop register achieves a digitizing resolution that cannot be provided by the prior art waveform digitizing method.

Referring again to FIG. 2, the waveform digitizing circuit 20 of the preferred embodiment of the present invention, features two identical L-type registers 22 and 24. The duplication of registers in the waveform digitizing circuit 20 is to bypass a register when one of its flip-flops enters a metastable state. A flip-flop or any clock device can enter an undefined state (neither high nor low) when the data input changes during the setup time interval preceding a clock pulse. In the preferred embodiment of the present invention, the input waveform may make transitions at any time. As such, there is a small but non-negligible probability that a transition may take place just as one of the L-type flip-flops 54 is sampling, and thus the flip-flop may enter the metastable state. It is well-known that a flip-flop or clock device that enters the metastable state will, if given enough time, "resolve" and enter one of its two normal stable states—high or low. But the time required by the flip-flop to resolve its metastable state is a random quantity whose value is defined statistically. The more time given to the flip-flop to resolve, the greater the probability that it will enter one of its two normal stable states. In general, if a flip-flop is allocated about one clock period for resolution, it will resolve with a probability that is essentially 100%.

When the flip-flop is in the metastable state, the flip-flop output may not be sampled since it is undefined. The flip-flop must be given one clock period of time in order to resolve before its output may be sampled. While the register is resolving, it may not sample the input waveform again since doing so would destroy the previous information in the register. In order not to lose the information about the input waveform during the time the register is resolving, two identical registers are used. One register samples while the other one resolves, so that no portion of the input waveform is lost.

Figure 5B:
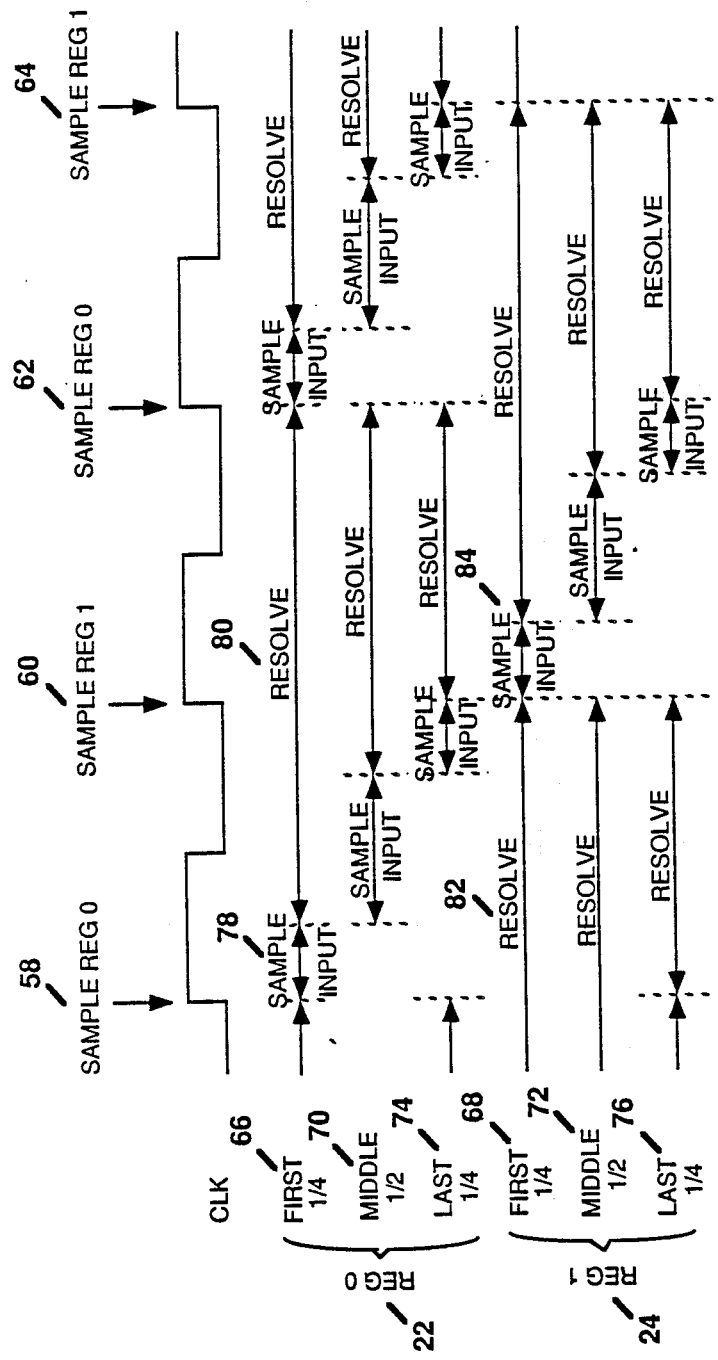
FIG. 5B is a timing diagram of the input into and outputs from the L-type register used in the preferred embodiment of the present invention.

The time available to each flip-flop 54 in either of the L-type registers 22 or 24 is a function of the location of the flip-flop 54 in the registers. The resolution time available to each flip-flop in the register is longest for the first flip-flop in the register and shortest for the last flip-flop in the register. The first flip-flop which is triggered by SDL $TAP_0$ has a resolution time that is well above $T_r$. In fact, the resolution time is $2T_r - T_r/N$, i.e. almost two clock periods. On the other hand, the last flip-flop which is triggered by SDL $TAP_{N-1}$ has the shortest resolution time—exactly $T_r$. Since a minimum resolution time of $T_r$ is required, all of the flip-flops 54 in either L-type registers 22 or 24 have at least a minimum amount of resolution time available to them. FIG. 5B is a timing diagram of the inputs into and the outputs from the L-type registers used in the preferred embodiment of the present invention. The reference clock 23 is sampled on alternate clock cycles 58 and 62 for register 22 and clock cycles 60 and 64 for L-type register 24. As described in the preceding paragraphs, registers 22 and register 24 each has at least 3 control sample inputs 66, 70, 74 and 68, 72, and 76, respectively. The mechanism to bypass the flip-flop entering a metastable state is illustrated by the sample and resolve cycle of the corresponding control sample inputs 66 and 68. In clock cycle 58, control sample signal 66 enables register 22 to sample the incoming waveform in stage 78. During the same clock cycle 58, control sample signal 68 enables L-type register 24 to enter the resolve stage 82. In the next clock cycle 60, the control sample signal 68 enables L-type register 24 to sample the incoming waveform in stage 84 while the control sample signal 66 enables L-type register 22 to enter the resolve stage in stage 80. Since neither the sample and resolve stages of the respective L-type registers overlap with each other, the problem associated with a flip-flop entering a metastable state is bypassed. Thus, the duplication of L-type registers in the preferred embodiment of the present invention provides sufficient setup and hold time for the registers without losing information about the incoming waveform.

Figure 6:
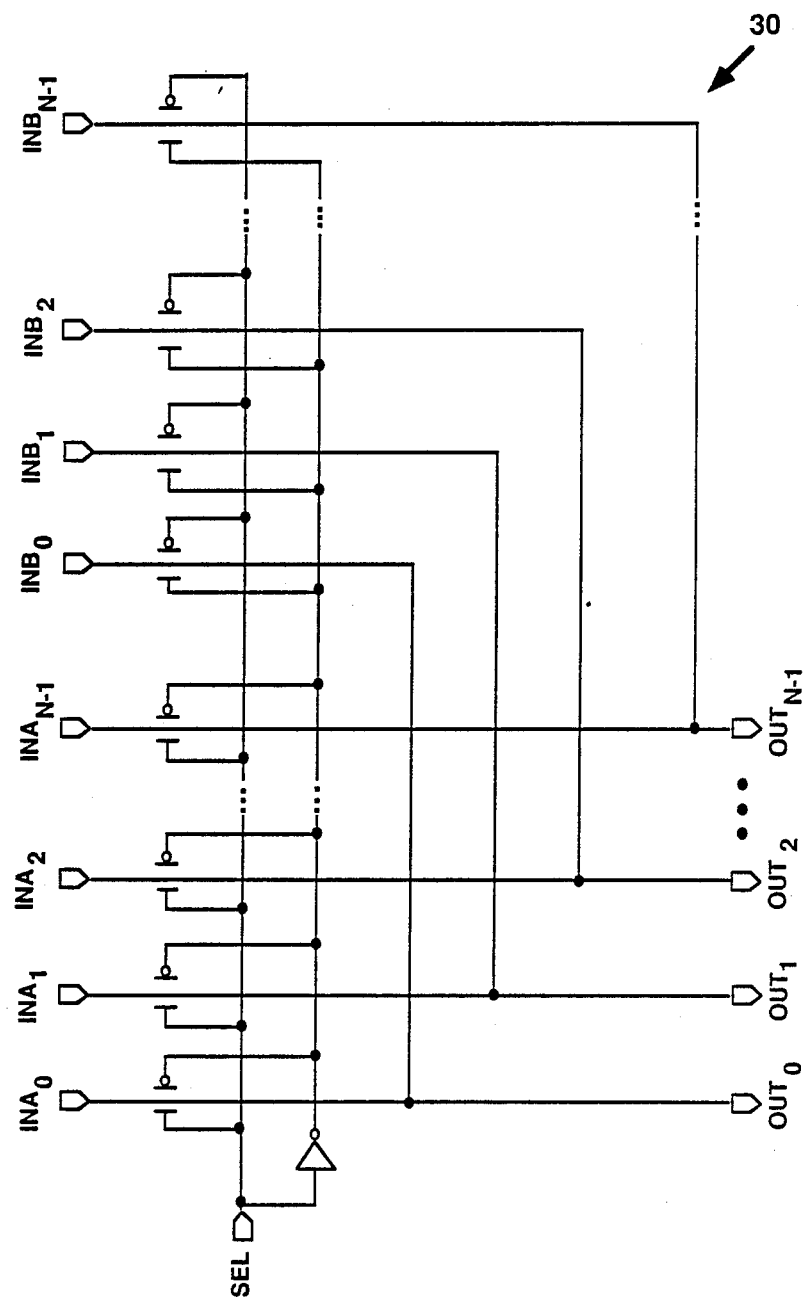
FIG. 6 is an electric schematic of a multiplexer used in the preferred embodiment of the present invention.

FIG. 6 is an electrical schematic of the multiplexer used in the preferred embodiment of the present invention. The multiplexer 30 receives $2 \times N$ inputs from L-type registers 22 and 24 while providing N outputs to the D-type register 32. The sampling enable circuit 28 is further coupled to the multiplexer 30. The multiplexer 30 is used to select the L-type register that has completed its resolution time and whose output is ready to be sampled. The D-type register 32 samples the output from the multiplexer 30 on every reference clock cycle. When the control sample signal 48 is low, the multiplexer 30 passes the input labeled "0" onto the D-type register 32. When the control sample signal 48 from the sample enable circuit 28 is high, it passes the input label "1" to the D-type register 32. The output of the D-type register 32 is the digitized waveform delayed by one clock.

Figure 7:
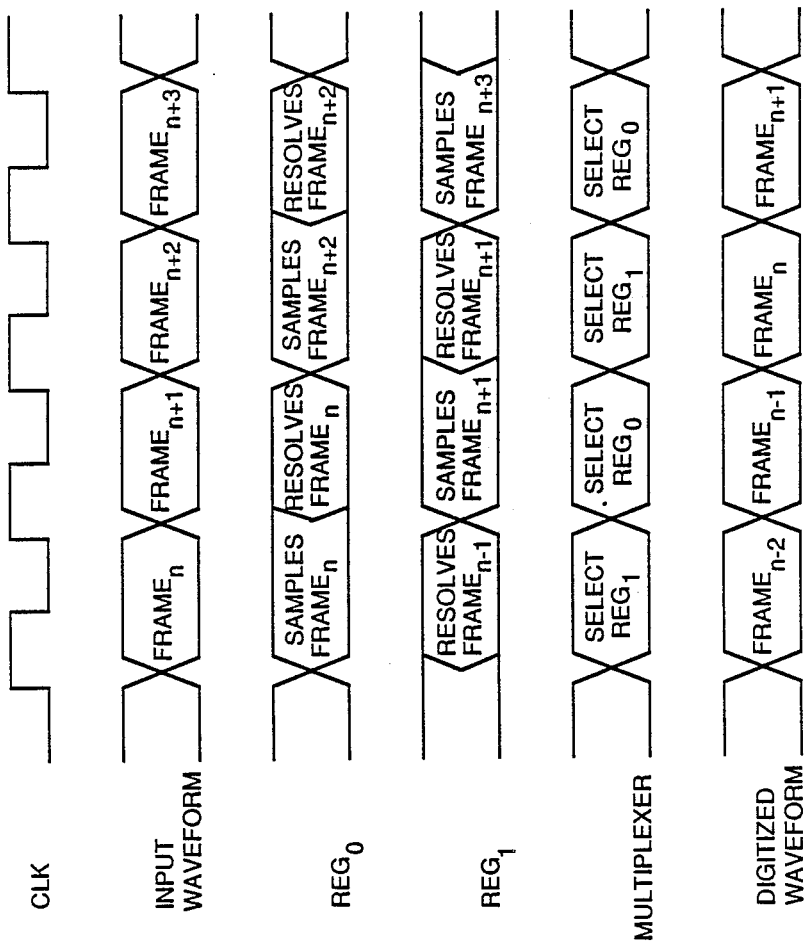
FIG. 7 is a timing diagram of the inputs into and outputs from the circuit used in the preferred embodiment of the present invention.

FIG. 7 is a timing diagram of the inputs into and outputs from the waveform digitizing circuit 20 used in the preferred embodiment of the present invention. The D-type register 32 provides a digitized snapshot of a $T_r$-long section of the incoming waveform on every clock. When these snapshots are viewed back to back as is done by the digital logic that processes the digitized waveform, a continuous digitized version of the incoming waveform is obtained. Thus, the present invention permits the digitizing of a waveform with a resolution that is much higher than that which is achievable with prior art method. It also follows that information about the transition, location of the transition, as well as the direction of the transition of a digitized waveform may be determined with a high degree of precision and subsequently processed in a conventional digital fashion.

While the present invention has been particularly described with reference to FIGS. 1-7 and with emphasis on integrated circuits, it should be understood that the figures are for illustration only and should not be taken as limitations on the invention. In addition, it is clear that the methods and apparatus of the present invention have utility in any application where analog-to-digital conversion of a waveform is required. It is contemplated that many changes and modifications may be made by one of ordinary skill in the art without departing from the spirit and scope of the invention as disclosed.

I claim:

1. An integrated circuit for digitizing a waveform at a first frequency with respect to an external clock having a second frequency, said integrated circuit comprising:
    a synchronous delay line means coupled to said external clock for generating N taps, said N taps corresponding to the resolution of the digitized waveform;
    a sample enable means coupled to said external clock for generating a plurality of control sample signals, said control sample signals initiating the sampling of said waveform at predetermined intervals;
    at least two sampling means coupled to said synchronous delay line means and said sample enable means for receiving said waveform, said sampling means sampling said waveform at N intervals, said sampling means further providing sufficient setup and hold time for said integrated circuit;
    a switching means coupled to said sampling means and said sample enable means for selecting the correct samples of said waveform upon the occurrence of a metastable state of said sampling means; and
    a delaying means coupled to said switching means and to said external clock for delaying said sampling from said switching means, said delaying means further delaying the inputs of said waveform samples by at least one clock interval.

2. The circuit as defined by claim 1, wherein said first frequency may be up to N times greater than said second frequency.

3. The circuit as defined by claim 1, wherein sample enable means comprises master-slave latches, said latches having their clock inputs coupled to said external clock for receiving synchronized reference clock signals, said latches having their Q outputs providing said plurality of control sample signals.

4. The circuit as defined by claim 1, wherein said sampling means comprises at least N L-type flip-flops, said flip-flops being each coupled to said SDL for receiving one of said N tap signals, said flip-flops being each coupled to said waveform for sampling said signals, said flip-flops being further coupled to said plurality of control sample signals from said sample enable means for selectively sampling said waveform.

5. The circuit as defined by claim 1, wherein said switching means switches alternatively between identical sets of said sampling means depending on said control sample signal from said sample enable means.

6. The circuit as defined by claim 1, wherein said delay means comprises a D-type register.

* * * * *